US010705578B2

(12) United States Patent
Franz et al.

(10) Patent No.: US 10,705,578 B2
(45) Date of Patent: Jul. 7, 2020

(54) HEAT REMOVAL FROM MEMORY MODULES

(71) Applicant: HEWLETT PACKARD ENTERPRISE DEVELOPMENT LP, Houston, TX (US)

(72) Inventors: John Franz, Houston, TX (US); William K. Norton, Houston, TX (US); Ernesto Ferrer Medina, Houston, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 16/191,916

(22) Filed: Nov. 15, 2018

(65) Prior Publication Data

US 2020/0159294 A1     May 21, 2020

(51) Int. Cl.
G06F 1/20        (2006.01)
H05K 1/02        (2006.01)
(Continued)

(52) U.S. Cl.
CPC ............ *G06F 1/20* (2013.01); *G11C 5/04* (2013.01); *H01L 23/427* (2013.01);
(Continued)

(58) Field of Classification Search
None
See application file for complete search history.

(56) References Cited

U.S. PATENT DOCUMENTS 4,190,098 A * 2/1980 Hanlon ............... H01L 23/4093
165/80.3
4,551,787 A * 11/1985 Mittal ................. H01L 23/3672
257/E23.098

(Continued)

FOREIGN PATENT DOCUMENTS

WO     WO-2011053313 A1     5/2011

OTHER PUBLICATIONS aliexpress.com, "2018 1pc B DDR DDR2 RAM Memory Heat Spreader Heatsink YF Cooler High Quality Physical Radiator Memory & Chipset Cooling," 2018, pp. 1-4 (online), Retrieved from the Internet on Oct. 10, 2018 at URL: <aliexpress.com/item/2018-1pc-B-DDR-DDR2-RAM-Memory-Heat-Spreader-Heatsink-YF-Cooler-High-Quality-Physical-Radiator/32905236083.html>.

*Primary Examiner* — Robert J Hoffberg
(74) *Attorney, Agent, or Firm* — Nolte Intellectual Property Law Group

(57) ABSTRACT

A system for cooling memory modules mounted in parallel on a printed circuit board may include a coolant tube installed in parallel between two of the memory modules, and a heat spreader disposed in parallel between the two memory modules. The heat spreader may include a base having an outer surface thermally coupled to the coolant tube and first and second fins. The first fin has a first spring force toward a first of the two memory modules. The first spring force causes the first fin to provide contact pressure to the first memory module to thermally couple the first fin and the first memory module. The second fin has a second spring force toward a second of the two memory modules. The second spring force causes the second fin to provide contact pressure to the second memory module to thermally couple the second fin and the second memory module.

18 Claims, 8 Drawing Sheets

(51) Int. Cl.
*H05K 7/20* (2006.01)
*G11C 5/04* (2006.01)
*H01L 27/108* (2006.01)
*H01L 23/473* (2006.01)
*H01L 23/427* (2006.01)

(52) U.S. Cl.
CPC ...... *H01L 23/473* (2013.01); *H01L 27/10844* (2013.01); *H01L 27/10897* (2013.01); *H05K 1/0209* (2013.01); *H05K 7/20254* (2013.01); *H05K 7/20509* (2013.01); *H05K 7/20772* (2013.01); *H05K 7/20809* (2013.01); *G06F 2200/201* (2013.01)

(56) References Cited

U.S. PATENT DOCUMENTS

| | | | |
|---|---|---|---|
| 6,349,035 B1* | 2/2002 | Koenen | H01L 23/4093 257/727 |
| 7,106,595 B2* | 9/2006 | Foster, Sr. | G06F 1/185 165/80.3 |
| 7,289,331 B2* | 10/2007 | Foster, Sr. | G06F 1/184 165/80.3 |
| 7,339,793 B2* | 3/2008 | Foster, Sr. | G06F 1/184 165/80.3 |
| 7,342,797 B2* | 3/2008 | Kamath | G06F 1/184 257/E23.102 |
| 7,400,505 B2* | 7/2008 | Campbell | H05K 7/20772 165/185 |
| 7,405,936 B1* | 7/2008 | Campbell | H05K 7/20772 165/80.2 |
| 7,408,776 B2* | 8/2008 | Campbell | H01L 23/473 361/699 |
| 7,639,498 B2* | 12/2009 | Campbell | H01L 23/473 361/699 |
| 7,876,564 B2 | 1/2011 | Monh et al. | |
| 7,907,398 B2* | 3/2011 | Hrehor, Jr. | H05K 7/20254 165/104.33 |
| 7,965,509 B2* | 6/2011 | Campbell | H01L 23/473 165/104.33 |
| 7,969,736 B1* | 6/2011 | Iyengar | H01L 23/36 165/104.33 |
| 8,139,355 B2* | 3/2012 | Motschman | G06F 1/20 165/104.33 |
| 8,537,563 B2* | 9/2013 | Purcell | H05K 1/148 361/796 |
| 8,570,744 B2* | 10/2013 | Rau | G06F 1/20 361/679.52 |
| 8,587,943 B2 | 11/2013 | Barina et al. | |
| 8,638,559 B2* | 1/2014 | Barina | H01L 23/4093 165/104.21 |
| 8,659,897 B2* | 2/2014 | Meijer | G06F 1/20 361/679.32 |
| 8,767,403 B2* | 7/2014 | Rau | G06F 1/20 361/721 |
| 8,947,873 B2* | 2/2015 | Campbell | H05K 7/20236 361/679.52 |
| 9,068,784 B2* | 6/2015 | Cox | H01L 23/367 |
| 9,089,076 B2* | 7/2015 | Cox | G06F 1/20 |
| 9,210,830 B2* | 12/2015 | Campbell | H05K 7/20236 |
| 9,245,820 B2 | 1/2016 | Goldrian et al. | |
| 9,370,122 B2* | 6/2016 | Chainer | H05K 7/20009 |
| 9,513,064 B2* | 12/2016 | Cox | H01L 23/367 |
| 10,021,814 B2* | 7/2018 | Aoki | G06F 1/20 |
| 10,334,757 B2* | 6/2019 | Cox | H01L 23/367 |
| 2006/0250772 A1* | 11/2006 | Salmonson | G06F 1/20 361/698 |
| 2009/0002951 A1 | 1/2009 | Legen et al. | |
| 2010/0085712 A1* | 4/2010 | Hrehor, Jr. | H05K 7/20254 361/699 |
| 2013/0342987 A1* | 12/2013 | Yang | G06F 1/20 361/679.32 |

* cited by examiner

HEAT REMOVAL FROM MEMORY MODULES

BACKGROUND

Electronic components (e.g., processing and memory components) included in computing systems, such as servers, generate heat during their operation. Accordingly, to prevent damage to the electronic components, cooling systems have been implemented in many computing systems to maintain the electronic components at acceptable operational temperatures. As the speeds and power consumption expectations of computing systems continue to increase and as more electronic components are placed within a given area on printed circuit boards, an expected challenge is removal of the heat generated by the electronic components operating within these systems.

BRIEF DESCRIPTION OF THE DRAWINGS

Features of the present disclosure are illustrated by way of example and not limited in the following figures, in which like numerals indicate like elements, in which.

DETAILED DESCRIPTION

Figure 1:
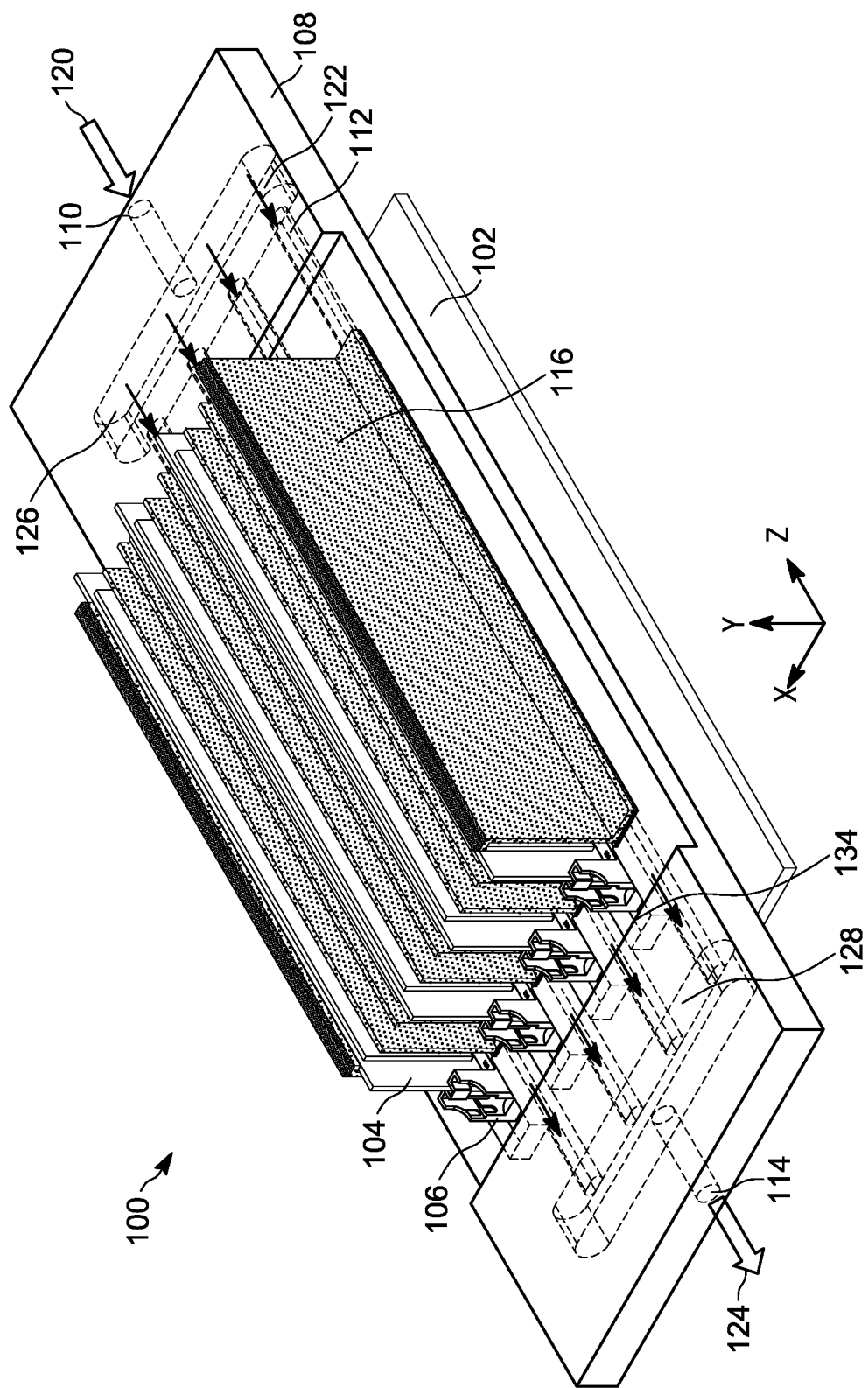
FIG. 1 depicts a perspective view of a computing device, according to an example of the present disclosure.

Several systems and techniques exist for cooling memory modules within computing systems. However, heat removal from some computing systems, such as exascale computing systems, is challenging due to a number of factors, including space limitations, cost constraints, performance limitations, scaling, and service and warranty restrictions. For example, some memory modules, such as dual in-line memory modules (DIMMs), are tightly spaced on printed circuit assemblies, leaving little room for disposing cooling systems therebetween or even pulling air between the memory modules.

Disclosed herein are systems for cooling memory modules mounted in parallel on a printed circuit board. Further disclosed herein are computing devices that includes one or more cooling systems for memory modules mounted to respective printed circuit assemblies. Also disclosed herein are methods for cooling memory modules mounted in parallel on a printed circuit board. Particularly disclosed herein is a system for cooling a plurality of memory modules mounted in parallel on a printed circuit board. The system includes a coolant tube installed on the printed circuit board in parallel between adjacent memory modules of the plurality of memory modules and a thermally conductive heat spreader disposed in parallel between the adjacent memory modules. The thermally conductive heat spreader includes a base having an outer surface thermally coupled to the coolant tube and first and second spring-loaded fins extending from the base. Each spring-loaded fin includes a spring force that causes the fin to be non-perpendicular to the base and, thereby, inclines or angles the fin relative to the base.

In one example, the first fin has a first spring force toward a first memory module of the adjacent memory modules, wherein the first spring force causes the first fin to provide contact pressure to the first memory module to thermally couple the first fin and the first memory module. Moreover, the second fin has a second spring force toward a second memory module of the adjacent memory modules, wherein the second spring force causes the second fin to provide contact pressure to the second memory module to thermally couple the second fin and the second memory module.

In at least one example according to the present disclosure, the thermal coupling between a spring-loaded fin and a lateral surface of a memory module may be a thermal interface that covers all or substantially all of the lateral surface, to maximize heat transfer from the memory module to the coolant tube and limit performance issues for a range of power consumption expectations. The coolant tube may extend at least a length of the memory module, and multiple coolant tubes with parallel flow paths may be installed on the printed circuit board, with the parallel flow paths interleaved between the plurality of memory modules to minimize the distance between the coolant tubes and the heat sources. This can further maximize heat transfer from the memory modules to the coolant tubes and limit performance issues for a range of power consumption expectations.

Installing the coolant tubes within a frame on the printed circuit board, instead of between lateral surfaces of the memory modules, addresses space constraints for some computing device layouts, for instance layouts that include two printed circuit assemblies disposed relative to each other such that memory modules mounted within one printed circuit assembly are interleaved with memory modules mounted within the other printed circuit assembly. Additionally, for this type of layout, the flexibility and resiliency of the spring-loaded fins enables thermal interfaces to be compressed one memory module at a time (instead of simultaneously) to limit damage to the thermal interfaces and, thereby, limit resulting restrictions to service and warranties for the respective memory modules.

Additionally, the disclosed cooling system can scale for different power consumption expectations and thicknesses of memory modules by using different heat spreader material and construction, e.g., permanently attached or removably coupled. Moreover, cost savings may be realized since the disclosed cooling systems do not include attaching cooling apparatus to the memory module prior to installation, thereby, enabling using industry standard memory modules within the computing system. For example, the disclosed cooling system allows for using standard DIMMs direct at the factory or by a customer instead of requiring a unique SKU assembled by a memory vendor.

FIG. 1 depicts a perspective view of a computing device 100, according to an example of the present disclosure. Computing device 100 is, for example, a printed circuit assembly that includes a printed circuit board (PCB) 102 onto which is mounted, disposed, or installed, multiple DIMMs 104 (only one indicated) and a system according to an example of the present disclosure for cooling the DIMMs 104. The PCB 102 includes tracks, pads, and other features etched thereon (not shown), which mechanically supports and electrically connects to the DIMMs 104 mounted thereon. In the example shown, four DIMMs 104 are mounted in parallel along an XZ-plane. Particularly, an end surface (also referred to herein as a longitudinal end surface) of each DIMM 104 is longitudinally mounted along a Z-axis using a mounting socket or connector 106 (only one indicated), such that one or more electrical contacts (not shown) accessible through the end surface can electrically connect to the PCB 102. Example DIMMs 104 include DDR4 SDRAMs, DDR5 SDRAMs, and NVMe-based memory modules.

The example cooling system includes four coolant tubes or pipes 112 (only one indicated) and four heat spreaders 116 (only one indicated) thermally coupled to the four coolant tubes 112. The heat spreaders 116 are longitudinally arranged along the Z-axis and interleaved with and thermally coupled to DIMMs 104. As disclosed herein, elements being "thermally coupled" means a coupling, either by direct or indirect contact, that creates a conductive thermal path for heat to flow from a heat-generating element, such as a DIMM, to a thermally conductive element, such as a heat spreader, constructed using a thermally conductive material which conducts the heat away from the heat-generating element so that the heat can be dissipated through a medium such as air or a liquid coolant. A thermal coupling by "direct contact" means that heat transfer is facilitated by the thermally conductive element physically touching the heat-generating element without any intermediary elements therebetween. A thermal coupling by "indirect contact" means that heat transfer is facilitated by at least one intermediary element such as a "thermal interface material" or "TIM" directly connected between the heat-generating element and the thermally conductive element. A "TIM" is an element, for example an elastically compressible element, constructed at least partially from thermally conductive material. Examples of TIMs include thermally conductive pads, also known as "gap pads" and thermally conductive greases.

The coolant tubes 112 contain, and in some examples provide a flow path for, a coolant. In one or more examples, the coolant may be a liquid coolant such as water. In the example shown, each of the coolant tubes 112 is longitudinally arranged along the Z-axis to support an active coolant tube assembly. For example, the coolant tubes 112 are connected into a coolant flow loop (not shown) having a pumping mechanism (not shown) to circulate the liquid coolant through the coolant tubes 112. As particularly shown, the four coolant tubes 112 are part of a coolant tube assembly that includes an inlet manifold 126 having an inlet tube 110 configured, for instance through a connection to the coolant flow loop, to direct liquid coolant into the coolant tubes 112. The coolant tube assembly further includes an outlet manifold 128 having an outlet tube 114 configured, for instance through a connection to the coolant flow loop, to output the liquid coolant as it flows from the coolant tubes 112. As shown, the coolant tubes 112 extend in parallel along the XZ-plane between the inlet manifold 126 and outlet manifold 128. Arrows 120, 122, and 124 illustrate, respectively, a direction of flow or circulation of the liquid coolant into the inlet tube 110, through the parallel paths of coolant tubes 112, and out of the outlet tube 114.

In another example, the coolant tubes 112 support a passive coolant tube assembly, wherein the coolant is contained within but not circulated through the coolant tubes 112. In this example, the coolant tubes 112 can be sealed on both ends to contain a liquid coolant, and elements 126 and 128 can be condenser plates, for instance copper plates. The condenser plates 126 and 128 are embedded in the frame 108 and thermally coupled the sealed ends of the coolant tubes 112. Alternatively, the coolant tube assembly includes a single condenser plate 126 or 128 thermally coupled to one sealed end of the coolant tubes 112.

As shown, the coolant tube assembly 110, 112, 114, 126, 128 can be installed, e.g., embedded, in a frame 108 that can be mounted to the PCB 102, for example using an adhesive and/or some other type of securing mechanism including one or more screws and/or sockets. In another example, at least part of the frame 108 in which the coolant tube assembly 110, 112, 114, 126, 128 is installed does not touch the PCB 102 but is mounted over the PCB 102. However, the frame 108 being "mounted on" the PCB 102 can include any of these variations. The coolant tube assembly 110, 112, 114, 126, 128 can be distinct from the frame 108 or some or all of the coolant tube assembly 110, 112, 114, 126, 128 can be integrated with the frame 108. In the illustrated example, the frame 108 includes or defines a plurality of openings 134 interleaved between the coolant tubes 112, and the DIMMs 104 and sockets 106 extend through the openings 134. This allows each of the DIMMs 104 to be in close proximity to one or more of the coolant tubes 112.

In a particular example, the coolant tube assembly 110, 112, 114, 126, 128 is constructed using copper, for instance to support using water as the coolant, and can be installed in a frame 108 constructed from a substrate such as plastic. However, the coolant tube assembly 110, 112, 114, 126, 128 can be constructed using any material that is compatible with the coolant contained therein. Additionally, at least one of the material for the coolant tube assembly 110, 112, 114, 126, 128 and the coolant contained therein can be selected to optimize thermal conduction and, thereby, heat removal from the DIMMs 104 for cooling the DIMMs 104. Other examples for constructing the coolant tube assembly 110, 112, 114, 126, 128 and/or the frame 108 include using injection molding and/or three-dimensional (3D) printing technology.

Figure 2:
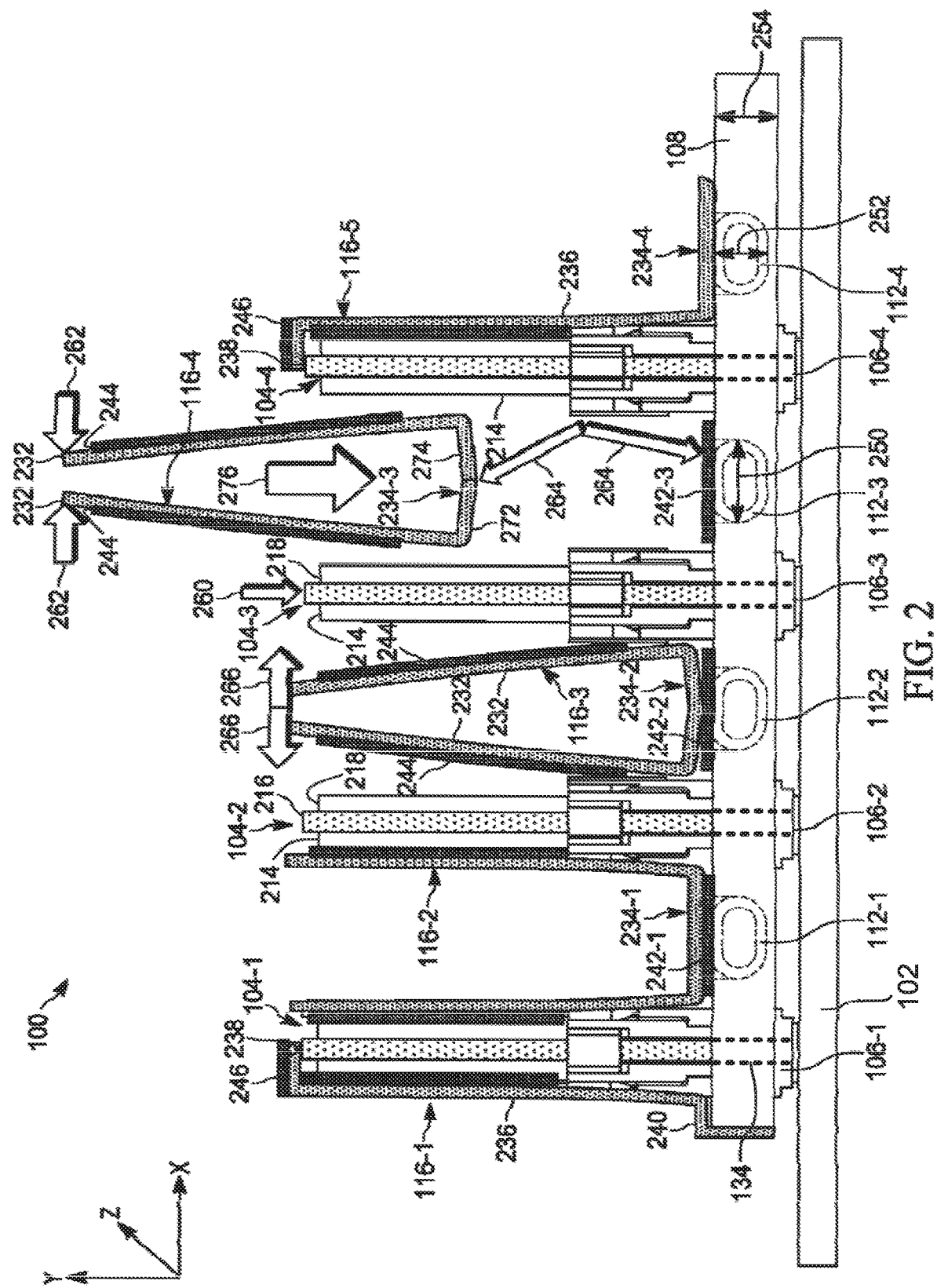
FIG. 2 depicts a front view of the computing device shown in FIG. 1.

Additional features according to examples of the present disclosure are described by reference to the remaining figures. FIG. 2 depicts a front view of the computing device 100 shown in FIG. 1. The DIMMs are individually labeled as 104-1 through 104-4 (also referred to collectively as DIMMs 104 or individually and generally as a DIMM 104). Each of the DIMMs 104 includes a PCB 216 having opposing lateral surfaces and opposing longitudinal end surfaces joining the opposing lateral surfaces. Each of the DIMMs 104 further includes memory chips 214 and 218 mounted on each opposing lateral surface of the PCB 216. Each of the DIMMs 104 has a vertical structure or is mounted vertically relative to the PCB 102. Accordingly, one of the longitudinal end surfaces of the PCB 216 is mounted and electrically connected to the PCB 102 with the opposing lateral surfaces of the PCB 216 extending from the connected end surface vertically or substantially vertically along a Y-axis. As such, outer lateral surfaces of the memory chips 214 and 216 form opposing outer lateral surfaces or sides of the DIMMs 104, and the opposing longitudinal end surfaces of the PCBs 216 form at least a portion of opposing longitudinal end surfaces of the DIMMs 104. Opposing longitudinal end surfaces of the memory chips 214 and 218 can, respectively, form a remainder of the opposing longitudinal end surfaces of the DIMMs 104. In an example, the DIMMs 104 are industry standard memory modules.

The cooling system includes four coolant tubes 112-1 through 111-4 (also referred to collectively as coolant tubes 112 or individually and generally as a coolant tube 112) installed on the PCB 102 in parallel within the frame 108. The DIMMs 104 are mounted to the PCB 102 through the openings 134 in the frame 108, such that the coolant tubes 112 are interleaved with the openings 134 near a lower region of the DIMMs 104 near the longitudinal end surface that is connected to the PCB 102. In an example, a height 254 of the frame 108 is about 4.1 mm, wherein about is within one tenth of a millimeter. A width 250 of the coolant tubes 112 is about 4.1 mm, and a height 252 of the coolant tubes 112 is about 3.6 mm. Moreover, the coolant tubes 112 can have an oval shape, as shown, to increase a surface area contact between the coolant tubes 112 and one of the heat spreaders 116 mounted thereto. Alternatively, the coolant tubes 112 have another shape.

The cooling system also includes five heat spreaders 116-1 through 116-5 (also referred to collectively as heat spreaders 116 or individually and generally as a heat spreader 116) interleaved with the DIMMs 104. Heat spreaders 116-2, 116-3, and 116-4 have a similar structure, which includes a base 234-1, 234-2, and 234-3, respectively, and two spring-loaded fins 232. Each base 234-1, 234-2, and 234-3 is joined, respectively, to ends of the two spring-loaded fins 232, such that the spring-loaded fins 232 extend away from the bases 234-1, 234-2, and 234-3 relative to the Y-axis. Each base 234-1, 234-2, and 234-3 has an outer surface 272 and an inner surface 274 opposing the outer surface 272. The "outer" surface of a base of a heat spreader faces the printed circuit board when the heat spreader is disposed thereon.

As illustrated, the outer surface 272 of the bases 234-1, 234-2, and 234-3 are, respectively, thermally coupled to the coolant tubes 112-1, 112-2, and 112-3 by indirect contact. Particularly, TIMs 242-1, 242-2, and 242-3 (also referred to collectively as TIMs 242 or individually and generally as a TIM 242) are respectively disposed between the coolant tubes 112-1, 112-2, and 112-3 and the outer surface 272 of the bases 234-1, 234-2, and 234-3. In one example, the TIMs 242 are compliant or compressible silicon pads having a tacky side that sticks to, and is thereby attached to, one of the coolant tubes 112 and a non-tacky side contacting but not sticking to the outer surface 272 of one of the bases 234-1, 234-2, and 234-3. The non-tacky side can be implemented, for example, by a thin protective non-stick liner or coating applied to the surface of the silicon pad.

The spring-loaded fins 232 of each head spreader 116-2, 116-3, 116-4 are biased, extend, or are inclined away from each other using a spring force that pushes in a direction indicated by arrows 266. In this example, when the heat spreaders 116-2, 116-3, and 116-4 and the DIMMs 104 are mounted or installed, the spring forces of the spring-loaded fins 232 are toward adjacent DIMMs 104 and causes the spring-loaded fins 232 to provide contact pressure to the adjacent DIMMs 104 to thermally couple the fins 232 and the adjacent DIMMs 104. The spring force maintains the contact and thermally coupling. In a particular example, the spring-loaded fins 232 contact and thermally couple the entirety or substantially the entirety of the sides of the DIMMs 104. In other examples, one or more of the spring-loaded fins 232 contact and thermally couple only a portion of the adjacent sides of the DIMMs 104.

Additionally, in the illustrated example, the spring-loaded fins 232 are thermally coupled to adjacent DIMMs 104 by indirect contact. Particularly, a TIM 244 is disposed between the spring-loaded fins 232 and the adjacent DIMMs 104. In one example, the TIMs 244 are compliant or compressible silicon pads having a tacky side that sticks to, and is thereby attached to, the spring-loaded fins 232 and a non-tacky side contacting but not sticking to the sides of the DIMMs 104. The configuration of the TIMs 242 and 244 allows the heat spreaders 116-2, 116-3, and 116-4 to be "removably coupled" to the DIMMs 104 and the coolant tubes 112-1, 112-2, and 112-3, meaning that the heat spreaders 116-2, 116-3, and 116-4 can be removed and/or replaced without damaging the TIMs 242 or the coolant tubes 112-1, 112-2, and 112-3 and without damaging or leaving a sticky residue on the adjacent DIMMs 104, which may need to be cleaned.

The heat spreaders 116-1 and 116-5 are respectively thermally coupled to DIMMs 104-1 and 104-4. Accordingly, since heat spreaders 116-1 and 116-5 are adjacent to a only one of the DIMMs 104, they each have a single spring-loaded fin 236. The heat spreader 116-5 includes a base 234 similar in structure to the bases of heat spreaders 116-2, 116-3, and 116-4. The base 234 is longitudinally joined to an end of the spring-loaded fin 236, such that the spring-loaded fin 236 extends away from the base 234 relative to the Y-axis. As illustrated, the outer surface 272 is thermally coupled to one of the coolant tube 112-4 by direct contact. For example, the outer surface 272 of the base 234 is "permanently affixed" to the coolant tube 112-4, meaning that the base 234 cannot be separated from the coolant tube 112-4 without damaging one or both of the heat spreader 116-5 or the coolant tube 112-4. Permanently affixing a heat spreader enables the heat spreader to remain in place when its single spring-loaded fin is flexed to install a DIMM, for instance as described later.

The spring-loaded fin 236 of head spreader 116-5 is biased, extends, or inclined using a spring force toward the outer lateral surface of the adjacent and parallel DIMM 104-4, when the heat spreader 116-5 and DIMM 104-4 are mounted to the PCB 102. Accordingly, when the heat spreader 116-5 and the DIMM 104-4 are mounted or installed, the spring force of the spring-loaded fin 236 causes the spring-loaded fin 236 to provide contact pressure to the adjacent DIMM 104-4 to thermally couple the fin 236 and the adjacent DIMM 104-4. The spring force maintains the contact and thermally coupling.

Additionally, in the illustrated example, the spring-loaded fin 236 is thermally coupled to the adjacent DIMM 104-4 by indirect contact. Particularly, a TIM 244 is disposed between the spring-loaded fin 236 and the adjacent DIMM 104-4. In one example, the TIM 244 is a compliant or compressible silicon pad having a tacky side that sticks to, and is thereby attached to, the spring-loaded fin 236 and a non-tacky side contacting but not sticking to the lateral surface of the DIMM 104-4.

The heat spreader 116-1 includes a base 240 longitudinally joined to an end of the spring-loaded fin 236, such that the spring-loaded fin 236 extends away from the base 240 relative to the Y-axis. The base 240 has outer and inner opposing surfaces, wherein the outer surface is permanently affixed, in this example to the frame 108. In one example, the outer surface of the base of a heat spreader can be affixed to the frame instead of to a coolant tube when another component or device, such as a processor, is mounted too close to the frame to allow installation of a coolant tube in the area between the other component and the frame.

The spring-loaded fin 236 of head spreader 116-1 is biased, extends, or inclined using a spring force toward the side of the adjacent and parallel DIMM 104-1, when the heat spreader 116-1 and DIMM 104-1 are mounted to the PCB 102. Accordingly, when the heat spreader 116-1 and the DIMM 104-1 are mounted or installed, the spring force of the spring-loaded fin 236 causes the spring-loaded fin 236 to provide contact pressure to the adjacent DIMM 104-1 to thermally couple the fin 236 and the adjacent DIMM 104-1. The spring force maintains the contact and thermally coupling.

Additionally, in the illustrated example, the spring-loaded fin 236 is thermally coupled to the adjacent DIMM 104-1 by indirect contact. Particularly, a TIM 244 is disposed between the spring-loaded fin 236 and the adjacent DIMM 104-1. In one example, the TIM 244 is a compliant or compressible silicon pad having a tacky side that sticks to, and is thereby attached to, the spring-loaded fin 236 and a non-tacky side contacting but not sticking to the side of the DIMM 104-1.

In the illustrated example, the spring-loaded fins 236 of the heat spreaders 116-1 and 116-5 have an overhang segment 238 thermally coupled to the longitudinal end surface of the respective end DIMMs 104-1 and 104-4. An "end" memory module is a memory module that is adjacent to only one other memory module in a plurality of parallel memory modules as opposed to being disposed between two memory modules of the plurality of parallel memory modules. The overhang segment 238 provides for another conductive thermal path for heat generated by the DIMMs 104-1 and 104-4 to be dissipated into the air. Another example feature of the spring-loaded fins 236 is a TIM 246 thermally coupled to the overhang segment 238 or which can be thermally coupled between the overhang segment 238 and the DIMMs 104-1 and 104-4 to protect the DIMMs 104-1 and 104-4 and/or enhance heat removal.

As shown in FIG. 2, the thermal coupling between the sides of the DIMMs 104 and the fins 232 and 236 of the heat spreaders 116 and between the heat spreaders 116 and the coolant tubes 112 create conductive thermal paths from the sides of the DIMMs 104 through the spring-loaded fins 232 and 236 to the liquid coolant within the coolant tubes 112. Thermally conductive material used to construct the heat spreaders 116s can be selected depending on the heat consumption expectations for the DIMMs 104. Example materials for constructing the heat spreaders 116 include Beryllium copper (e.g., for 12-18 W applications), stainless steel (e.g., for 6-12 W applications), and thermally conductive plastic (e.g., for less than 6 W applications). Accordingly, the heat spreaders 116 are also referred to herein as thermally conductive heat spreaders.

A feature of the arrangement of the coolant tubes 112 according to an example of the present disclosure is the interleaving of the coolant tubes 112 with the DIMMs 104. This arrangement minimizes the distance between the coolant tubes 112 and the heat source (in this case the DIMMs 104) to maximize heat extraction. An additional feature of the heat spreaders 116 according to an example of the present disclosure is the "spring-loaded" property of the fins 232 and 236. The "spring-loaded" or resilient property is a consequence at least in part of a flexible material used to construct the fins 232 and 236 that enables the fins 232 and 236 and the bases 234 and 240 of the heat spreaders 116 to return by spring-force to an original shape or bias after being moved from it's original shape or bias including from being flexed, bent, pressed, squeezed, etc. Thus, thermal conductivity and resiliency are combined into the construction of the fins 232 and 236 allowing the fins 232 and 236, in some examples, to flex outward toward the DIMMs 104 and maintain contact pressure with the DIMMs 104. Thermal conductivity and resiliency combined into the construction of the fins 232 and 236 can also allow the elimination of parts and assembly steps for some example cooling systems according to the present disclosure as compared to some existing cooling systems.

Figure 3:
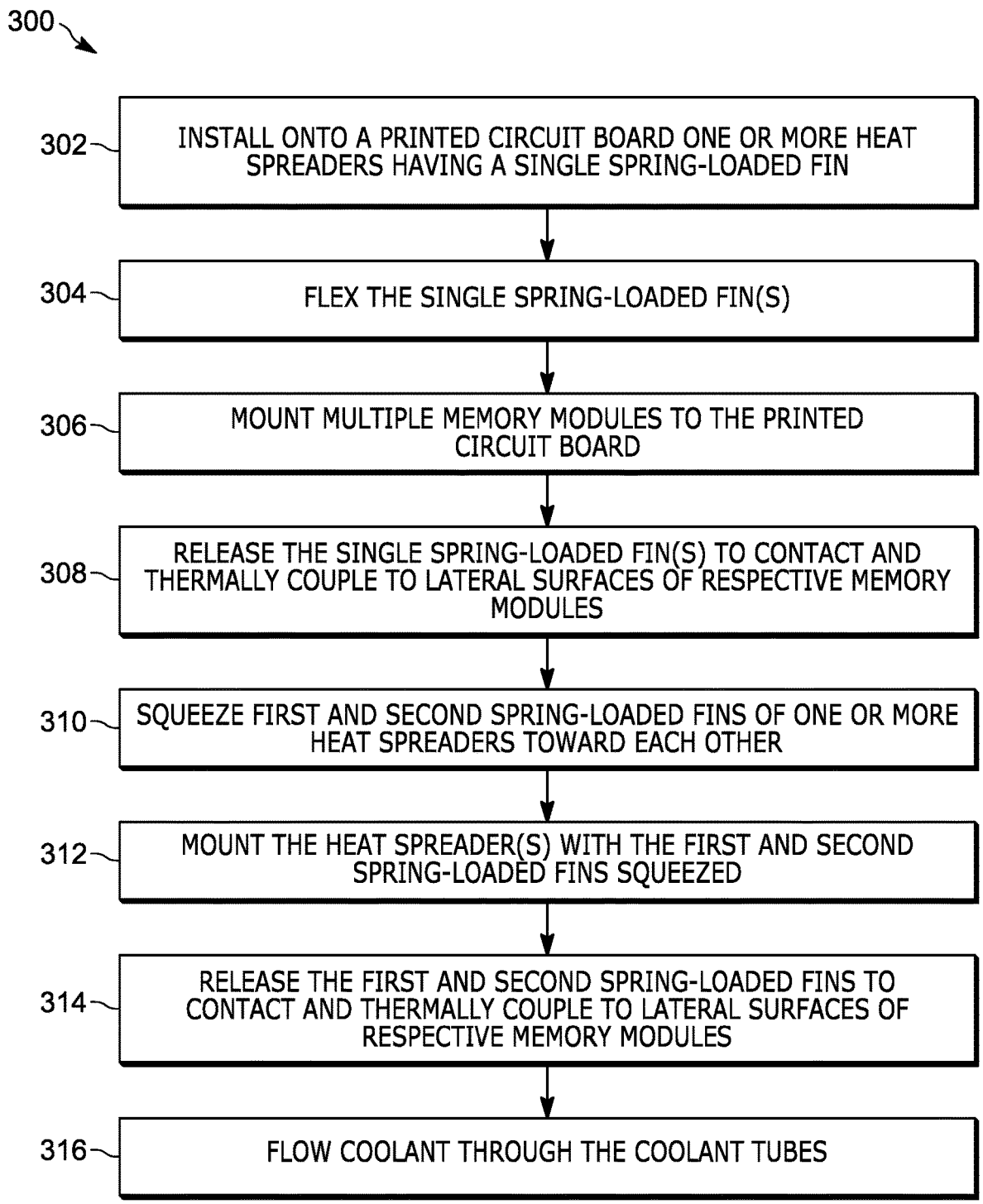
FIG. 3 depicts a flow diagram of a method for cooling memory modules of the computing device depicted in FIGS. 1 and 2, according to an example of the present disclosure.

FIG. 3 depicts a flow diagram of a method 300 for cooling memory modules of the computing device 100 depicted in FIGS. 1 and 2, according to an example of the present disclosure. The method 300 proceeds whereby elements of the computing device 100 are installed within or mounted on the PCB 102 to enable the cooling system to extract heat from the DIMMs 104. In this example implementation, at least some of the heat spreaders 116 are mounted after mounting the DIMMs 104.

In one example, the heat spreaders 116-1 and 116-5 having the single spring-loaded fin 236 are permanently affixed (302). Namely, as illustrated, the outer surface of the base 240 is permanently affixed to the frame 108, and the outer surface of the base 234-4 is permanently affixed to the coolant tube 112-4. The DIMMs 104 are mounted (306) into the connectors 112 on the PCB 102, as illustrated by arrow 260 of FIG. 2. Flexing (304) the fins 236 in an opposing direction to the spring force, allows mounting the DIMMs 104-1 and 104-4 without damaging the DIMMs 104-1 and 104-4 and without damaging the thermal interface provided by the TIMs 244. The spring-loaded fins 236 can be flexed manually by an installer or mechanically flexed using a suitable tool that doesn't damage the thermal interface. After mounting the DIMMs 104-1 and 104-4, the spring-loaded fins 236 are released (308) to contact and thermally couple to sides of the respective DIMMs 104-1 and 104-4. Alternatively, all of the DIMMs 104 are mounted before the heat spreaders 116.

Next heat spreaders 116-2, 116-3, and 116-4 are mounted, with arrow 276 of FIG. 2 illustrating the mounting of heat spreader 116-4. In one example, the heat spreaders 116-2, 116-3, and 116-4 are mounted one at a time to minimize damage to the DIMMs 104, heat spreaders 116-2, 116-3, and 116-4, and/or thermal interfaces 244. To mount heat spreaders 116-2, 116-3, and 116-4, spring-loaded fins 232 are squeezed (310) toward each other in opposite directions to the spring force, as indicated by arrows 262 of FIG. 2. The heat spreaders 116-2, 116-3, and 116-4 are mounted (312) with the fins 232 squeezed, such that the outer surface of the bases 234-1, 234-2, and 234-3 contact the respective TIMs 242-1, 242-2, and 242-3, as indicated by arrows 264 of FIG. 2. Whereupon, the spring-loaded fins 232 are released (314), as indicated by arrows 266 of FIG. 2, to contact and thermally couple to the DIMMs 104. In one example, coolant within the coolant tubes 112, for instance coolant flowing (316) through or contained within the coolant tubes 112, can be used to dissipate the heat generated by the DIMMs 104 to, thereby, cool the DIMMs 104.

Figure 4:
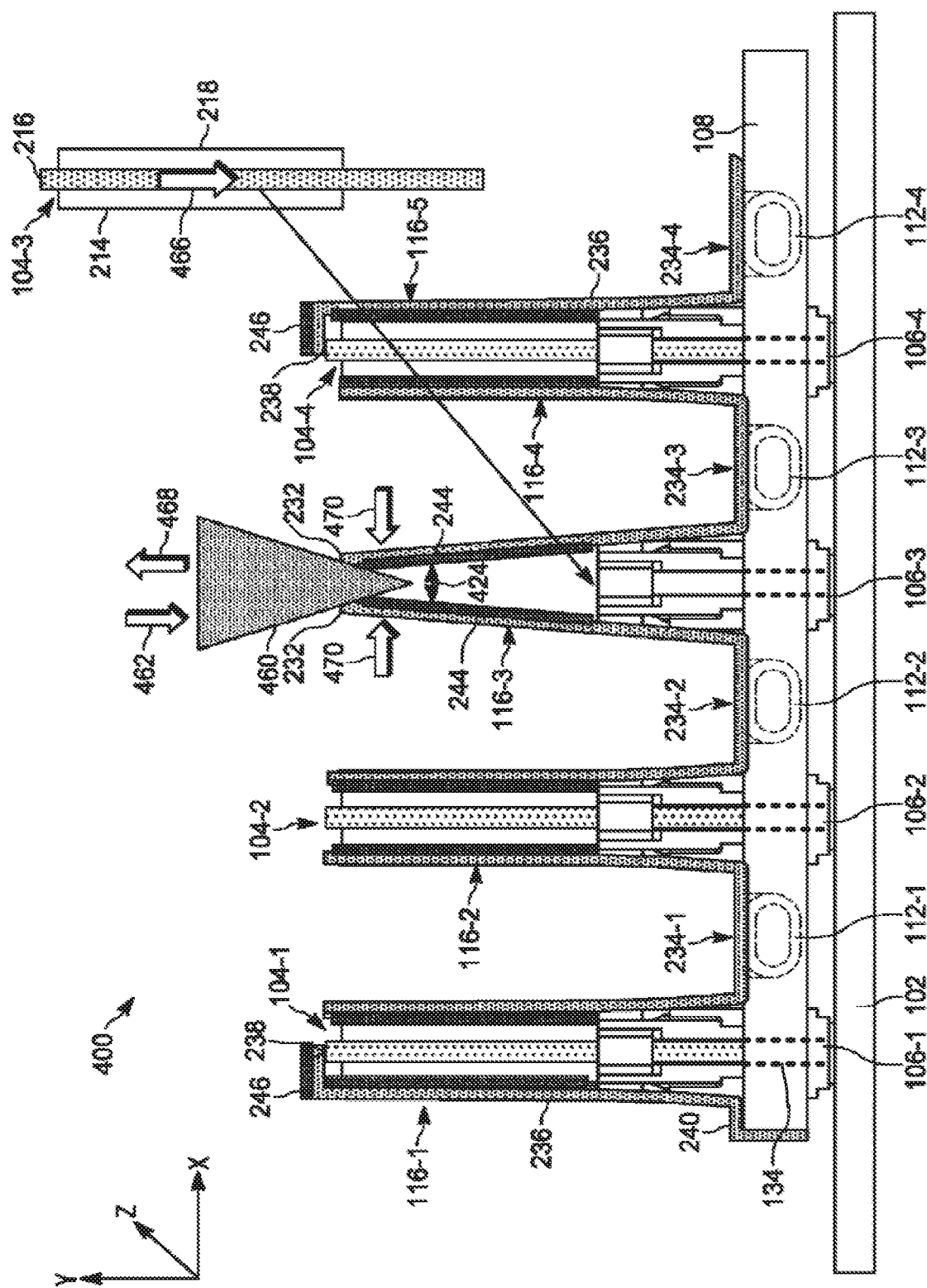
FIG. 4 depicts a front view of a computing device, according to an example of the present disclosure.

FIG. 4 depicts a front view of a computing device 400, according to an example of the present disclosure. The computing device 400 is structurally similar to the computing device 100 illustrated in FIGS. 1 and 2, as indicated by some of the same reference numbers used in both figures. However, a difference between computing devices 100 and 400 includes the outer surfaces 272 of the respective bases 234-1, 234-2, and 234-3 of heat spreaders 116-2, 116-3, and 116-4 being permanently affixed to the respective coolant tubes 112-1, 112-2, and 112-3. The example computing device 400 configuration facilitates mounting all of the heat spreaders 116 before mounting the DIMMs 104, for example as described by reference to FIG. 5.

Permanently affixing all of the heat spreaders 116 can eliminate thermal resistance in the conductive thermal path causes by the TIMs 242 and can, thereby, improve heat extraction and resultantly improve performance of the computing device 400. Additionally, eliminating the TIMs 242 can reduce cost of the computing device 400 and reduce cost in the assembly process by reducing the number of assembly steps.

Figure 5:
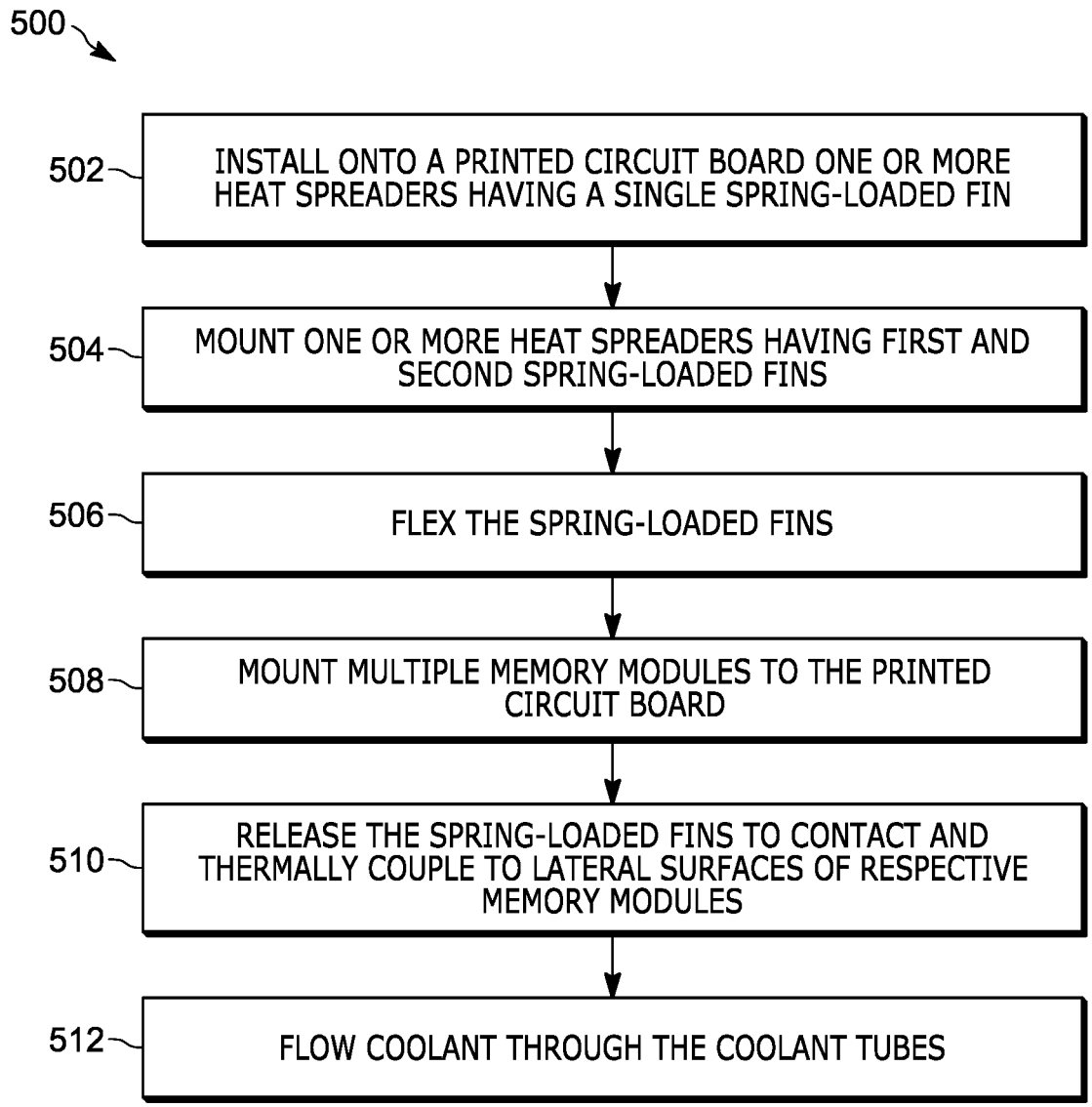
FIG. 5 depicts a flow diagram of a method for cooling memory modules of the computing device depicted in FIG. 4, according to an example of the present disclosure.

FIG. 5 depicts a flow diagram of a method 500 for cooling memory modules of the computing device 400 depicted in FIG. 4, according to an example of the present disclosure. As mentioned above, all of the heat spreaders 116 are permanently affixed within the computing device 400, at 502 and 504. The spring-loaded fins 232 and 236 are flexed (506) in a direction (indicated by arrows 424 of FIG. 4) opposing the direction of the spring force, as indicated by arrows 470 of FIG. 4. For example, a wedge-shaped tool 460 is inserted, for instance as indicated by arrow 462 of FIG. 4, between adjacent fins 232 and 236 of different heat spreaders 116.

The DIMMs 104 are mounted (508) into the connectors 112, as indicated by an arrow 466 of FIG. 4 illustrating the mounting of DIMM 104-3. Whereupon, the tool 460 is removed, at indicated by arrow 468 of FIG. 4, to release (510) the spring-loaded fins 232 and 236 to contact and thermally couple to the DIMMs 104. In one example, coolant within the coolant tubes 112, for instance coolant flowing (512) through or contained within the coolant tubes 112, can be used to dissipate the heat generated by the DIMMs 104 to, thereby, cool the DIMMs 104.

Figure 6:
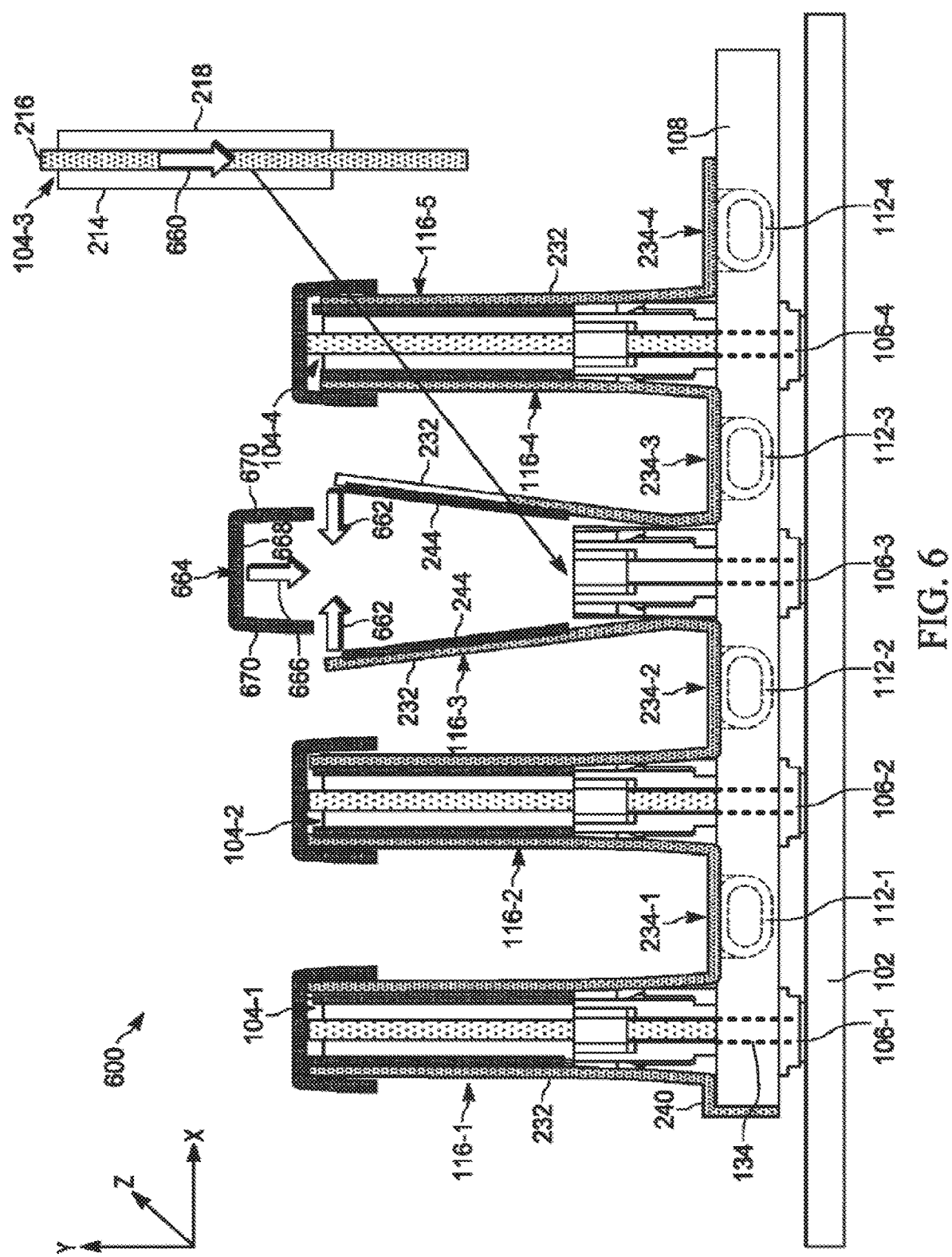
FIG. 6 depicts a front view of a computing device, according to an example of the present disclosure.

FIG. 6 depicts a front view of a computing device 600, according to an example of the present disclosure. The computing device 600 is structurally similar to the computing device 100 illustrated in FIGS. 1 and 2, as indicated by some of the same reference numbers used in both figures. However, a difference between computing devices 100 and 600 includes the outer surfaces 272 of the respective bases 234-1, 234-2, and 234-3 of heat spreaders 116-2, 116-3, and 116-4 being permanently affixed to the respective coolant tubes 112-1, 112-2, and 112-3. Thus, the example computing device 600 configuration facilitates mounting all of the heat spreaders 116 before mounting the DIMMs 104, for example as described by reference to FIG. 7. Another difference is the bias of the spring-loaded fins 232 and 236, wherein in this example the spring force pushes the fins 232 and 236 away from the adjacent memory modules 104 when the heat spreaders 116 and the memory modules 104 are mounted to the PCB 102. The fins 232 and 236 are secured to the DIMMs 104 using a securing device 664, such as a clip, having a connecting segment 668 longitudinally extending along the Z-axis, and two lateral segments 670 extending from opposing ends of the connecting segment 668.

Figure 7:
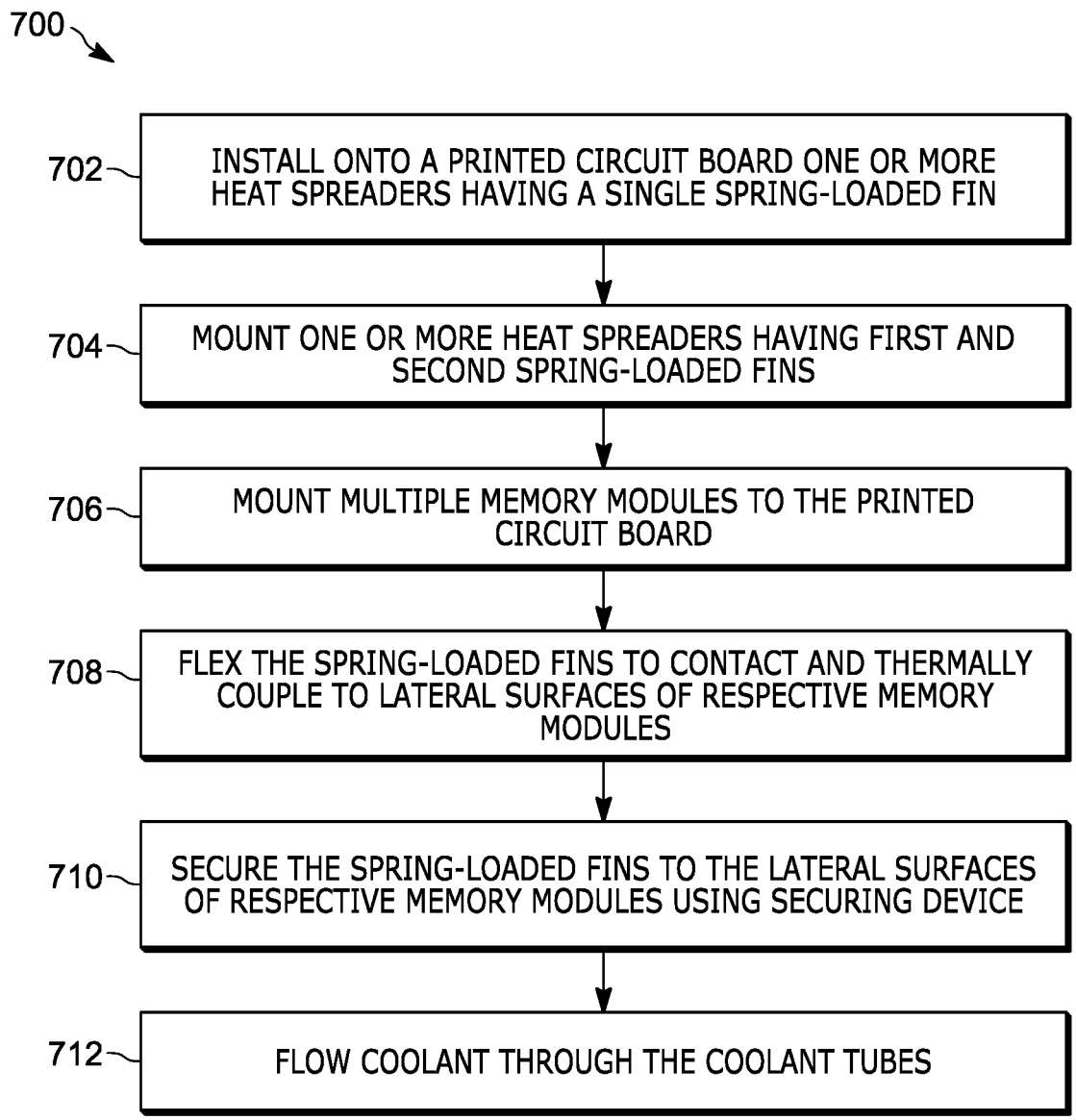
FIG. 7 depicts a flow diagram of a method for cooling memory modules of the computing device depicted in FIG. 6, according to an example of the present disclosure.

FIG. 7 depicts a flow diagram of a method 700 for cooling memory modules of the computing device 600 depicted in FIG. 6, according to an example of the present disclosure. As mentioned above, all of the heat spreaders 116 are permanently affixed within the computing device 600, at 702 and 704. The DIMMs 104 are mounted (706) into the connectors 112, as indicated by an arrow 660 of FIG. 6 illustrating the mounting of DIMM 104-3. The spring-loaded fins 232 and 236 are flexed (708) in a direction indicated by arrows 662 of FIG. 6, which opposes the direction of the spring force of the fins 232 and 236. The spring-loaded fins 232 and 236 are flexed (708) to contact and thermally couple the spring-loaded fins 232 and 236 and sides of the DIMMs 104.

Securing devices 664 are used to hold or secure (710) the fins 232 and 236 in place, as indicated by an arrow 666, illustrating the clip 664 that will be used to hold the adjacent spring-loaded fins 232 in contact with and thermally coupled to the opposing sides of the DIMM 104-3. In a particular example, the connecting segment 668 of a memory module 664 overhangs a respective DIMM 104 and adjacent spring-loaded fins 232 and 236, and the lateral segments 670 of the securing device 664 apply respective forces that oppose the spring forces of the spring-loaded fins 232 and 236 to hold the adjacent fins 232 and 236 into contact with the memory module 104 to thermally couple the adjacent fins 232 and 236 and the memory module 104. In another example, coolant within the coolant tubes 112, for instance coolant flowing (712) through or contained within the coolant tubes 112 can be used to dissipate the heat generated by the DIMMs 104 to, thereby, cool the DIMMs 104.

In yet another example, instead of all of the heat spreaders 116 being permanently affixed to the coolant tubes 112, some of the heat spreaders 116 could be removably coupled to the coolant tubes 112 before the mounting the DIMMs 104. For instance, similar to the computing device 100 shown in FIGS. 1 and 2, the heat spreaders 116-2, 116-3, and 116-4 can be mounted after the DIMMs 104. In such an example, the computing device 600 can further include TIMs 242 disposed between the outer surface 272 of the respective bases 234-1, 234-2, and 234-3 of heat spreaders 116-2, 116-3, and 116-4 and the respective coolant loops 112-1, 112-2, and 112-3.

Figure 8:
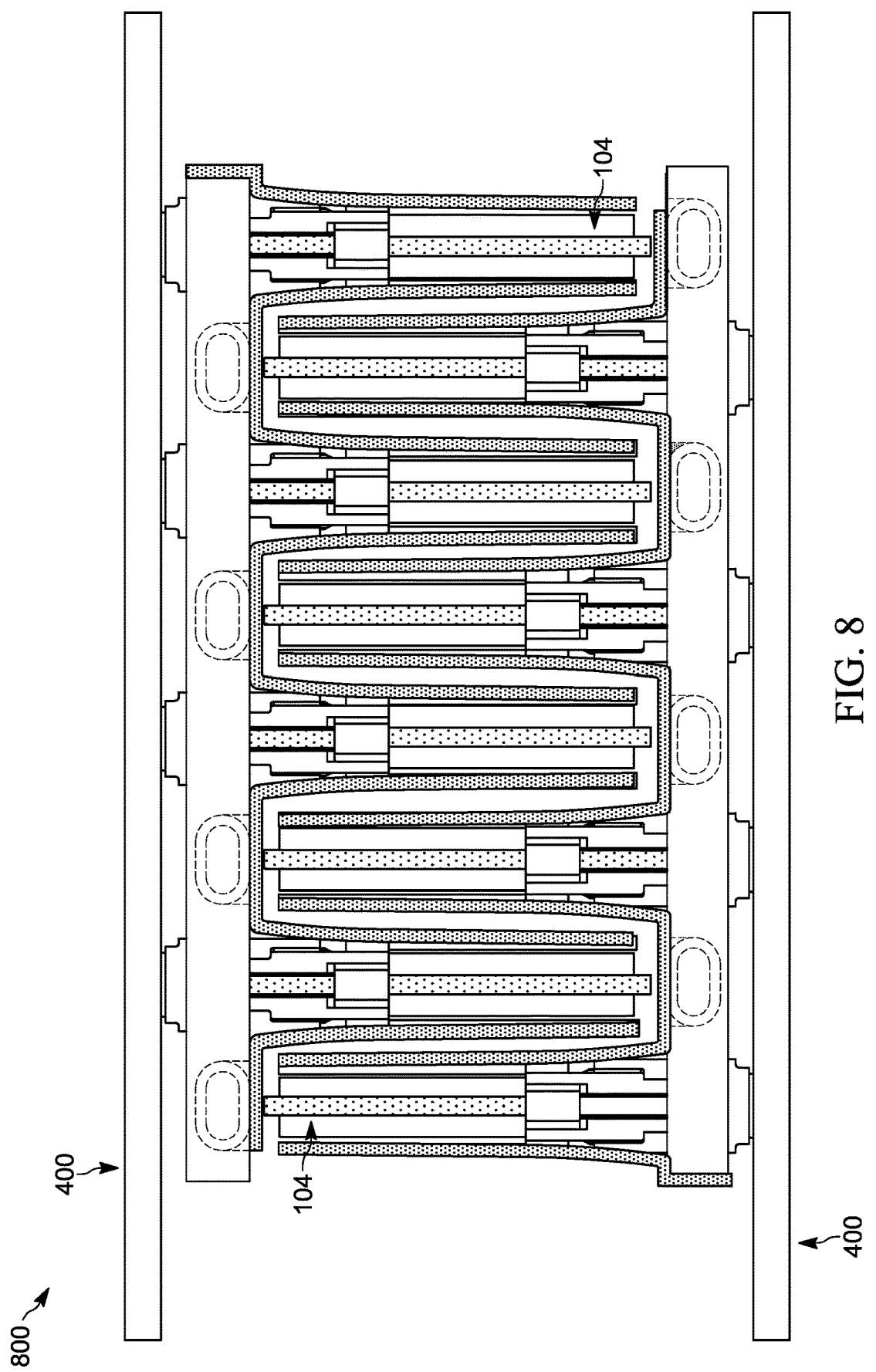
FIG. 8 depicts a front view of a computing device including multiple printed circuit assemblies, according to an example of the present disclosure.

FIG. 8 depicts a front view of a computing device 800 according to an example of the present disclosure. In this example, computing device 800 includes two computing devices, for instance two computing devices 400, which are disposed relative to one another such that the DIMMs 104 of one computing device 400 are interleaved with the DIMMs 104 of the other computing device 400. Although two computing devices having a configuration of computing device 400 are shown, the combination of computing devices in this configuration can include any combination of the computing device configurations shown in FIGS. 1, 2, 4, and 6 or other examples or implementations described herein or envisioned in accordance with the present disclosure.

In general, a computing device 800 in accordance with this example includes a first printed circuit board 102 disposed relative to a second printed circuit board 102. Particularly, the computing device 800 includes: a first plurality of memory modules 104 mounted in parallel on the first printed circuit board 102; a first coolant tube assembly; and a first plurality of thermally conductive heat spreaders 116 interleaved with the first plurality of memory modules 104. The first coolant assembly can include a first frame 108 mounted on the first printed circuit board 102 and a first plurality of coolant tubes installed 112 in parallel in the first frame 108. Each thermally conductive heat spreader 116 can include: a base 234 having an outer surface 272 thermally coupled to one of the coolant tubes 112; a first fin 232 extending from the base 234 and having a first spring force, wherein the first fin 232 contacts a first adjacent memory module 104 of the first plurality of memory modules 104 to thermally couple the first fin 232 and the first adjacent memory module 104; and a second fin 232 extending from the base 234 and having a second spring force, wherein the second fin 232 contacts a second adjacent memory module 104 of the first plurality of memory modules 104 to thermally couple the second fin 232 and the second adjacent memory module 104.

The example computing device 800 also includes: a second plurality of memory modules 104 mounted in parallel on the second printed circuit board 102; a second coolant tube assembly; and a second plurality of thermally conductive heat spreaders 116 interleaved with the second plurality of memory modules 104. The second coolant tube assembly can include a second frame 108 mounted on the second printed circuit board 102 and a second plurality of coolant tubes 112 installed in parallel in the second frame 108. Each thermally conductive heat spreader 116 can include: a base 234 having an outer surface 272 thermally coupled to one of the coolant tubes 112 in the second plurality of coolant tubes 112; a first fin 232 extending from the base 234 and having a first spring force, wherein the first fin 232 contacts a first adjacent memory module 104 of the second plurality of memory modules 104 to thermally couple to the first adjacent memory module 104 of the second plurality of memory modules 104; and a second fin 232 extending from the base 234 and having a second spring force, wherein the second fin 232 contacts a second memory module 104 of the second plurality of memory modules 104 to thermally couple to the second adjacent memory module 104 of the second plurality of memory modules 104. The first printed circuit board 102 is disposed relative to the second printed circuit board 102 such that the memory modules 104 in the first plurality of memory modules 104 are interleaved with the memory modules 104 in the second plurality of memory modules 104.

For simplicity and illustrative purposes, the present disclosure is described by referring mainly to examples thereof. In the above description, numerous specific details are set forth in order to provide a thorough understanding of the present disclosure. It will be readily apparent, however, that the present disclosure may be practiced without limitation to these specific details. For instance, the examples illustrate the present disclosure being practiced to cool DIMMs within a computing device. However, the present disclosure may be practiced without limitation to cool other types of memory modules and other types of electronic components within a computing device. Moreover, the computing devices depicted in the drawings show an example number of representative elements. However, the computing devices may include more or fewer elements than is depicted, and may depict only a portion of a larger computing device intended for inclusion within a computing system. Additionally, some of the elements depicted may be removed and/or modified without departing from a scope of the examples described. In other instances, some methods and structures have not been described in detail so as not to unnecessarily obscure the present disclosure. As used herein, the term "includes" means includes but not limited to, and the term "including" means including but not limited to. Also, the term "has" means has but not limited to, and the term "having" means having but not limited to. Herein, the term "about" when applied to a value generally means within the tolerance range of the equipment used to produce the value, or in some examples, means plus or minus 10%, or plus or minus 5%, or plus or minus 1%, unless otherwise expressly specified.

What is claimed is:

1. A system for cooling a plurality of memory modules mounted in parallel on a printed circuit board, the system comprising:
   a coolant tube installed on the printed circuit board in parallel between adjacent memory modules of the plurality of memory modules;
   a thermally conductive heat spreader disposed in parallel between the adjacent memory modules, the thermally conductive heat spreader comprising:
      a base having an outer surface thermally coupled to the coolant tube;
      a first fin extending from the base and having a first spring force toward a first memory module of the adjacent memory modules, wherein the first spring force causes the first fin to provide contact pressure to the first memory module to thermally couple the first fin and the first memory module; and
      a second fin extending from the base and having a second spring force toward a second memory module of the adjacent memory modules, wherein the second spring force causes the second fin to provide contact pressure to the second memory module to thermally couple the second fin and the second memory module; and
   a frame mounted on the printed circuit board, wherein the coolant tube is installed in the frame, wherein the frame defines a plurality of openings, and each of the plurality of memory modules extends through a respective one of the openings of the plurality of openings.

2. The system of claim 1, further comprising:
   a plurality of thermally conductive heat spreaders including the thermally conductive heat spreader, the plurality of thermally conductive heat spreaders interleaved with the plurality of memory modules on the printed circuit board, each of the thermally conductive heat spreaders comprising the base and the first and second fins, and each of the first and second fins thermally coupling one of the adjacent memory modules of the plurality of memory modules; and
   a plurality of coolant tubes including the coolant tube, the plurality of coolant tubes interleaved with the plurality of memory modules on the printed circuit board, wherein the outer surface of the base of each of the thermally conductive heat spreaders is thermally coupled to one of the coolant tubes.

3. The system of claim 2, further comprising a coolant tube assembly, the coolant tube assembly comprising:
   an inlet manifold to receive a liquid coolant and to direct the liquid coolant into the plurality of coolant tubes; and
   an outlet manifold to receive the liquid coolant from the plurality of coolant tubes and to discharge the liquid coolant, wherein the coolant tubes extend longitudinally between the inlet manifold and the outlet manifold.

4. The system of claim 1, further comprising:
   a first thermal interface material disposed between the first fin and the first memory module; and
   a second thermal interface material disposed between the second fin and the second memory module, wherein the first thermal interface material and the second thermal interface material each have a tacky side attached to a respective one of the first or the second fin and a non-tacky side contacting the respective one of the first or second memory modules.

5. The system of claim 1, wherein the coolant tube has a first sealed end and a second sealed end to contain a coolant within the coolant tube, the system further comprising one or both of:
   a first condenser plate thermally coupled to the first sealed end; and/or
   a second condenser plate thermally coupled to the second sealed end.

6. The system of claim 1, further comprising a thermal interface material having a tacky side attached to the coolant tube and a non-tacky side contacting the outer surface of the base of the thermally conductive heat spreader.

7. The system of claim 1, wherein the base of the thermally conductive heat spreader is permanently affixed to the coolant tube.

8. The system of claim 1, wherein the first memory module is an end memory module having a first outer lateral surface contacting the first fin and a second outer lateral surface, the system further comprising:
- a second coolant tube installed on the printed circuit board parallel to the first coolant tube; and
- a second thermally conductive heat spreader disposed parallel to the first memory module, the second thermally conductive heat spreader comprising:
  - a base having an outer surface thermally coupled to the second coolant tube; and
  - a single fin having a spring force toward the second outer lateral surface of the first memory module, wherein the spring force causes the single fin to provide contact pressure to the second outer lateral surface of the first memory module to thermally couple the single fin and the first memory module.

9. The system of claim 1, wherein the first memory module is an end memory module having a first outer lateral surface contacting the first fin and a second outer lateral surface, the system further comprising:
- a second thermally conductive heat spreader disposed parallel to the first memory module, the second thermally conductive heat spreader comprising:
  - a single fin having a spring force toward the second outer lateral surface of the first memory module, wherein the spring force causes the single fin to provide contact pressure to the first outer lateral surface of the first memory module to thermally couple the single fin and the first memory module; and
  - a permanently affixed base longitudinally connected to the single fin.

10. The system of claim 9, wherein:
- the first memory module further comprises a first longitudinal end surface and a second longitudinal end surface opposing the first longitudinal end surface and electrically connected to the printed circuit board; and
- the single fin comprises an overhang segment thermally coupled to the first longitudinal end surface.

11. A computing device comprising:
- a first plurality of memory modules mounted in parallel on a first printed circuit board;
- a first coolant tube assembly comprising:
  - a first frame mounted on the first printed circuit board; and
  - a first plurality of coolant tubes installed in parallel in the first frame; wherein
    - the first frame has a plurality of openings interleaved with the first plurality of coolant tubes, and
    - each of the first plurality of memory modules extends through a respective one of the plurality of openings; and
- a first plurality of thermally conductive heat spreaders interleaved with the first plurality of memory modules, each of the first plurality of thermally conductive heat spreaders comprising:
  - a first base having a first outer surface thermally coupled to one of the first plurality of coolant tubes;
  - a first fin extending from the first base and having a first spring force, wherein the first fin contacts a first memory module of the first plurality of memory modules to thermally couple the first fin and the first memory module; and
  - a second fin extending from the first base and having a second spring force, wherein the second fin contacts a second memory module of the first plurality of memory modules to thermally couple the second fin and the second memory module, the second memory module adjacent to the first memory module.

12. The computing device of claim 11, further comprising:
- a second plurality of memory modules mounted in parallel on a second printed circuit board;
- a second coolant tube assembly comprising:
  - a second frame mounted on the second printed circuit board; and
  - a second plurality of coolant tubes installed in parallel in the second frame; and
- a second plurality of thermally conductive heat spreaders interleaved with the second plurality of memory modules, each of the second plurality of thermally conductive heat spreaders comprising:
  - a second base having a second outer surface thermally coupled to one of the second plurality of coolant tubes in the second plurality of coolant tubes;
  - a third fin extending from the second base and having a third spring force, wherein the third fin contacts a third memory module of the second plurality of memory modules to thermally couple to the third memory module of the second plurality of memory modules; and
  - a fourth fin extending from the base and having a fourth spring force, wherein the fourth fin contacts a fourth memory module of the second plurality of memory modules to thermally couple to the fourth memory module of the second plurality of memory modules, the fourth memory module adjacent to the third memory module;
- wherein, the first printed circuit board is disposed relative to the second printed circuit board such that the first and second memory modules in the first plurality of memory modules are interleaved with the third and fourth memory modules in the second plurality of memory modules.

13. The computing device of claim 11, wherein the first coolant tube assembly further comprises:
- a first manifold installed in the first frame, the first manifold to direct liquid coolant into the first plurality of coolant tubes; and
- a second manifold installed in the first frame, the second manifold to output the liquid coolant as the liquid coolant flows from the first plurality of coolant tubes, wherein the first plurality of coolant tubes extend longitudinally between the first and second manifolds.

14. The computing device of claim 11, wherein:
- the first spring force in one or more of the first plurality of thermally conductive heat spreaders is toward the first memory module and causes the first fin to provide contact pressure to the first memory module to thermally couple the first fin and the first memory module; and
- the second spring force in the one or more of the first plurality of thermally conductive heat spreaders is toward the second memory module and causes the second fin to provide contact pressure to the second memory module to thermally couple the second fin and the second memory module.

15. The computing device of claim 11, wherein:
- the first spring force of each of the first fin of the first plurality of thermally conductive heat spreaders pushes the first fin away from the first memory module;

the second spring force of each of the second fin of the first plurality of thermally conductive heat spreaders pushes the second fin away from the second memory module; and the computing device further comprises:
a set of securing devices each comprising:
a connecting segment;
a first lateral segment extending from a first end of the connecting segment;
a second lateral segment extending from a second end of the connecting segment,
wherein the connecting segment overhangs one of the memory modules and adjacent ones of the first and second fins, and the first and second lateral segments apply respective forces that oppose the first and second spring forces to hold the adjacent ones of the first and second fins into contact with the first memory module to thermally couple the adjacent ones of the first and second fins and the first memory module.

16. A method for cooling memory modules mounted in parallel on a printed circuit board, the method comprising:
mounting a thermally conductive heat spreader in parallel between two of the memory modules, the thermally conductive heat spreader comprising a first fin and a second fin extending from a base, the first fin having a first spring force toward a first one of the two of the memory modules, the second fin having a second spring force toward a second one of the two of the memory modules, and the thermally conductive heat spreader mounted such that an outer surface of the base is thermally coupled to a coolant tube installed on the printed circuit board;

mounting a frame on the printed circuit board, wherein the coolant tube is installed in the frame, wherein the frame defines a plurality of openings, and each of the plurality of memory modules extends through a respective one of the openings of the plurality of openings;

flexing the first and second fins in directions opposing the first spring force and the second spring force;

releasing the first fin so that the first spring force causes the first fin to provide contact pressure to the first one of the memory modules to thermally couple the first fin and the first one of the memory modules; and releasing the second fin so that the second spring force causes the second fin to provide contact pressure to the second memory module to thermally couple the second fin and the second memory module, wherein a conductive thermal path is created from the first and second ones of the memory modules through the first fin and the second fin to a coolant within the coolant tube.

17. The method of claim 16, wherein the outer surface of the base of the thermally conductive heat spreader is permanently affixed to the coolant tube before mounting the two of the memory modules, and the thermally conductive heat spreader is mounted before mounting the two of the memory modules.

18. The method of claim 16, further comprising disposing a thermal interface material between the outer surface of the base of the thermally conductive heat spreader and the coolant tube, the thermally conductive heat spreader mounted after mounting the two of the memory modules.

* * * * *